(12) United States Patent
Chen

(10) Patent No.: US 6,781,363 B2
(45) Date of Patent: Aug. 24, 2004

(54) MEMORY SORTING METHOD AND APPARATUS

(76) Inventor: Han-ping Chen, P.O. Box 2871, Saratoga, CA (US) 95070

( * ) Notice: Subject to any disclaimer, the term of this patent is extended or adjusted under 35 U.S.C. 154(b) by 160 days.

(21) Appl. No.: 09/884,971

(22) Filed: Jun. 21, 2001

(65) Prior Publication Data

US 2002/0196012 A1 Dec. 26, 2002

(51) Int. Cl.[7] .............................................. G01R 31/28
(52) U.S. Cl. ...................... 324/158.1; 209/573; 414/935
(58) Field of Search ................................. 324/754–755, 324/760, 765, 537, 555, 158.1; 209/571, 573–574, 546, 561, 576, 599; 414/294, 935, 937, 403–404

(56) References Cited

U.S. PATENT DOCUMENTS

| | | | | |
|---|---|---|---|---|
| 5,150,797 A | * | 9/1992 | Shibata | 209/573 |
| 5,313,156 A | * | 5/1994 | Klug et al. | 324/158.1 |
| 5,996,996 A | * | 12/1999 | Brunelle | 209/573 |
| 6,104,183 A | * | 8/2000 | Kobayashi et al. | 324/158.1 |
| 6,313,652 B1 | * | 11/2001 | Maeng | 324/760 |

* cited by examiner

*Primary Examiner*—Minh N. Tang

(57) ABSTRACT

A method and apparatus performs testing, sorting, and packaging of partially defective semiconductor memory devices in order to construct usable memory chip or module packages that meet the specification of a fully or partially functional package.

37 Claims, 12 Drawing Sheets

US 6,781,363 B2

MEMORY SORTING METHOD AND APPARATUS

BACKGROUND OF THE INVENTION

This invention relates to the testing, sorting, and packaging of semiconductor memory devices, memory chips, memory modules, and defective memory components.

Due to the yield limitation of semiconductor fabrication process, a semiconductor memory wafer usually contains defective memory devices. These defective memory devices are declared as unusable because the defects within the device are beyond the repairing capability of the device fabrication process.

We may categorize the types of defective memory devices by the defective data bit positions. For a memory device with eight data bits, there are 255 types of defective memory devices. The large number of defective memory types complicates the issue regarding to the testing, sorting, and packaging of these memory devices.

BRIEF SUMMARY OF THE INVENTION

This invention proposes a method and apparatus to sort memory device dies and chips in order to utilize partially defective memory devices to construct usable memory chips or modules that meet the specification of a functional package.

The present invention provides a method that reduces the complexity in the device and chip testing, sorting, and packaging.

This invention provides a method to reduce the large number of defective memory device types.

This invention provides a method that automates the testing, sorting, and packaging process to minimize human intervention.

This invention provides a method that maximizes the usage of functional memory data bits in the partially defective memory devices.

DETAILED DESCRIPTION OF THE INVENTION

The present invention will be illustrated with the structure of the target memory packages and some preferred embodiments.

Figure 1:
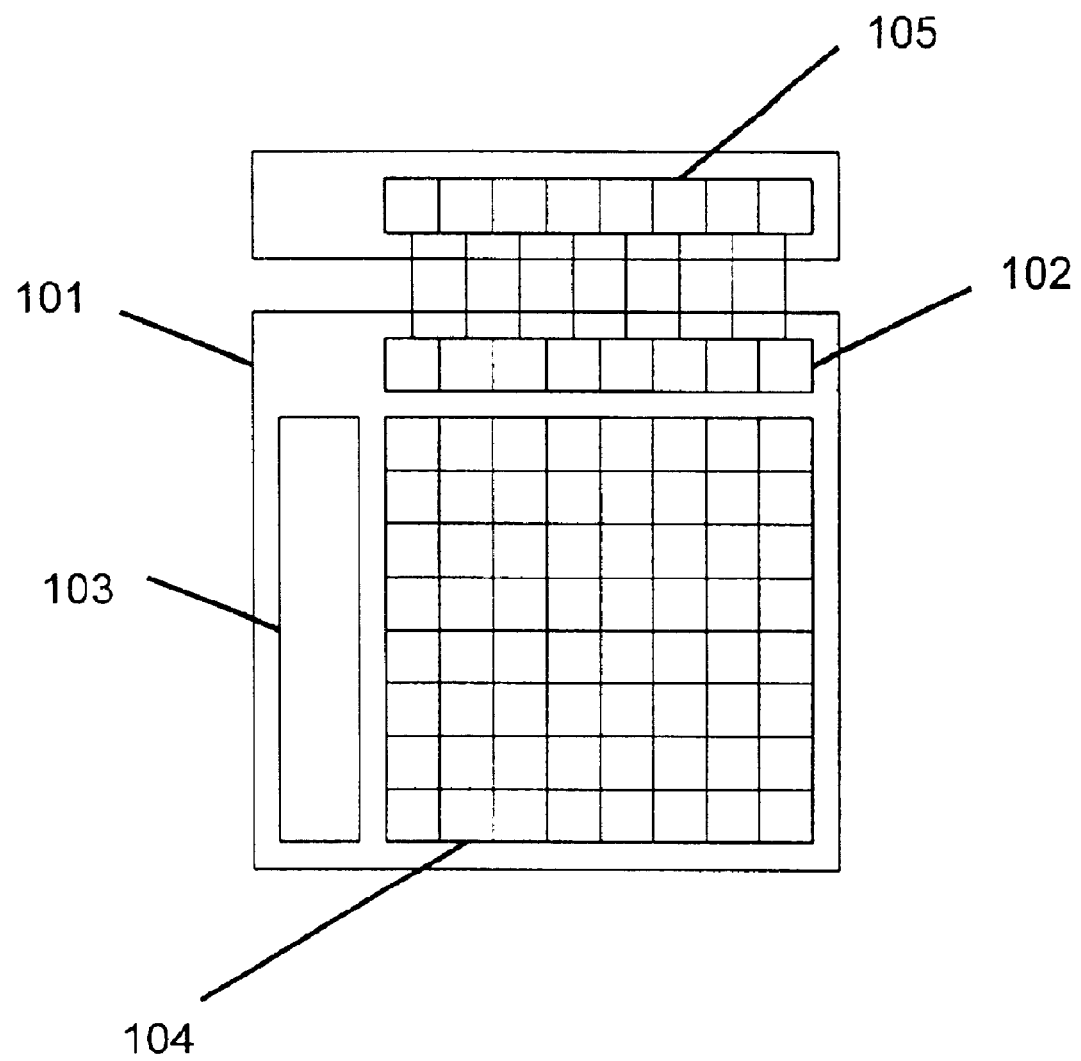
FIG. 1 is a diagram of a functional memory chip package.

FIG. 1 is a diagram of a functional memory chip package. The memory device 101 contains device data bit points 102, a memory address control unit 103, and a memory cell array 104. The device data bit points 102 are connected to the corresponding chip data bit points 105.

Figure 2:
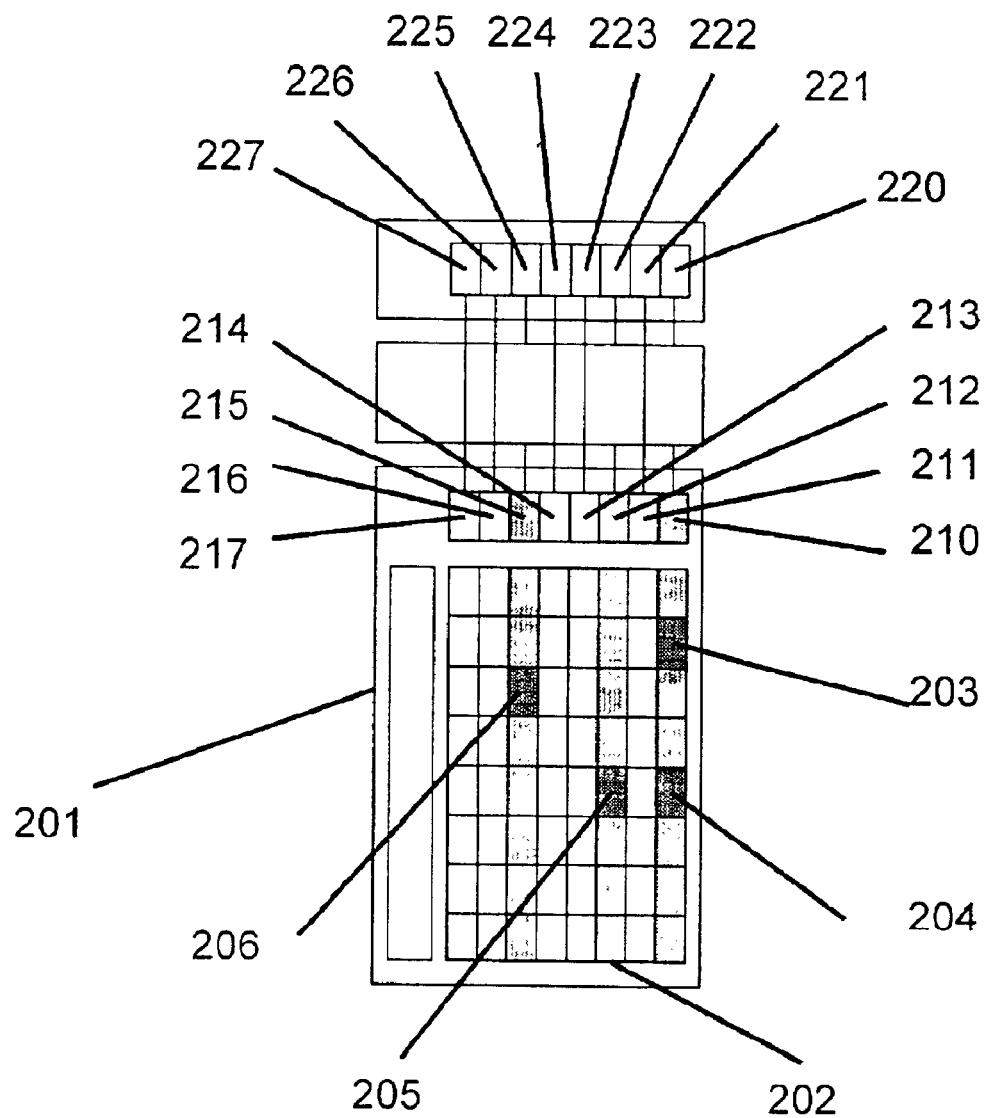
FIG. 2 shows a partially defective memory chip package.

FIG. 2 shows a partially defective memory chip package. In memory device 201, the memory cell array 202 contains defective memory cells within memory blocks 203, 204, 205, and 206.

The memory data bits corresponding to device data bit points 211, 213, 214, 216 and 217 are marked as functional because they do not contain any defective memory blocks. These data bit points are mapped onto chip data bit points 221, 223, 224, 226, and 227, each with a connecting mechanism. In this package, the connecting mechanisms are metal wires during a wire bonding process.

The memory data bits corresponding to device data bit points 210, 212, and 215 are marked as defective because they contain at least one defective memory blocks. These data bit points are mapped onto chip data bit points 220, 222, and 225, each with a disconnecting mechanism. In this package, the disconnecting mechanisms are open circuit conditions without any wire connections.

Figure 3:
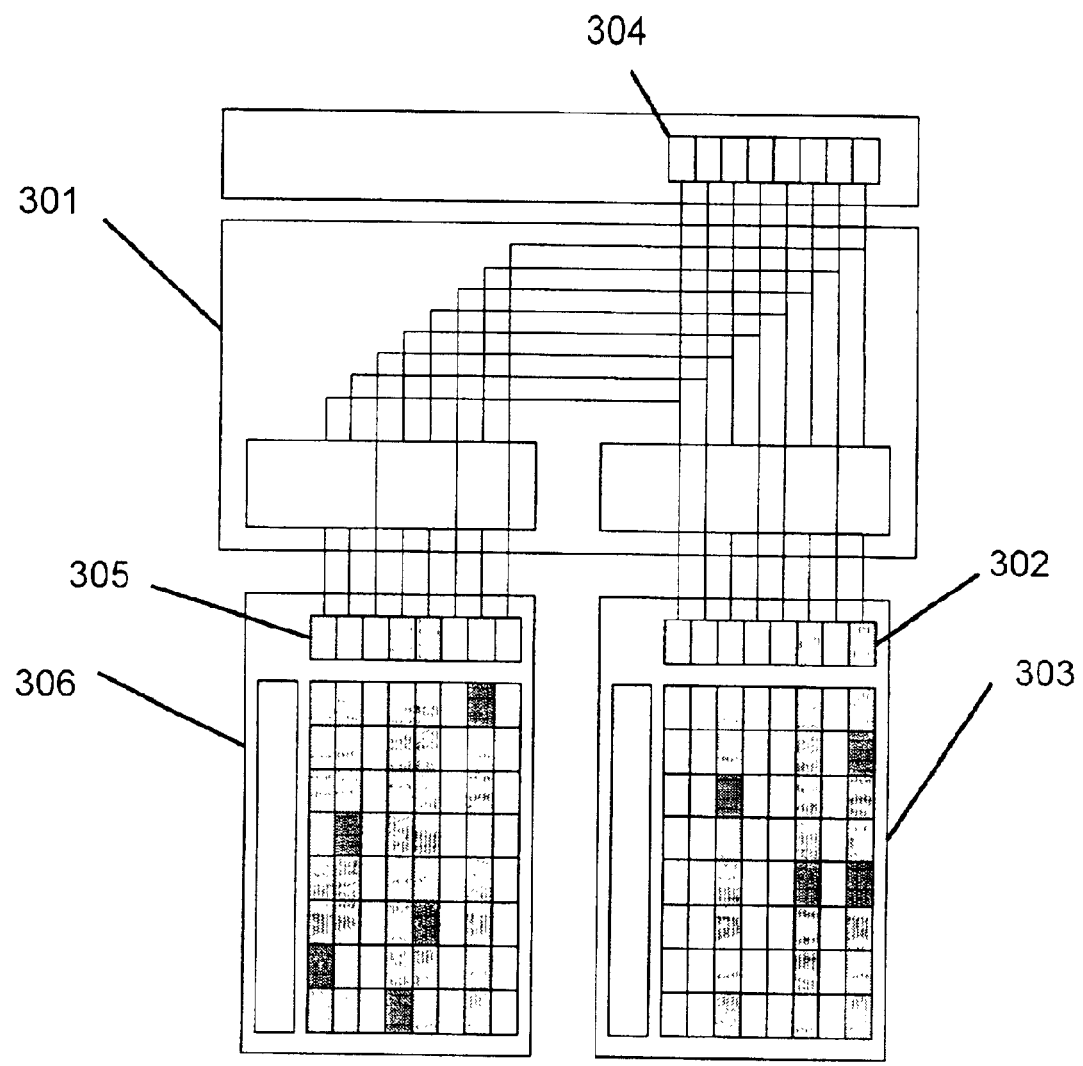
FIG. 3 shows a functional memory package constructed from two partially defective memory devices.

FIG. 3 shows a functional memory package constructed from two partially defective memory devices. The data bit mapping element 301 maps the device data bit points 302 of the memory device 303 to selected package data bit points 304 using a mapping structure similar to FIG. 2. It also maps the device data bit points 305 of the memory device 306 to remaining package data bit points using a similar mapping structure.

Figure 4:
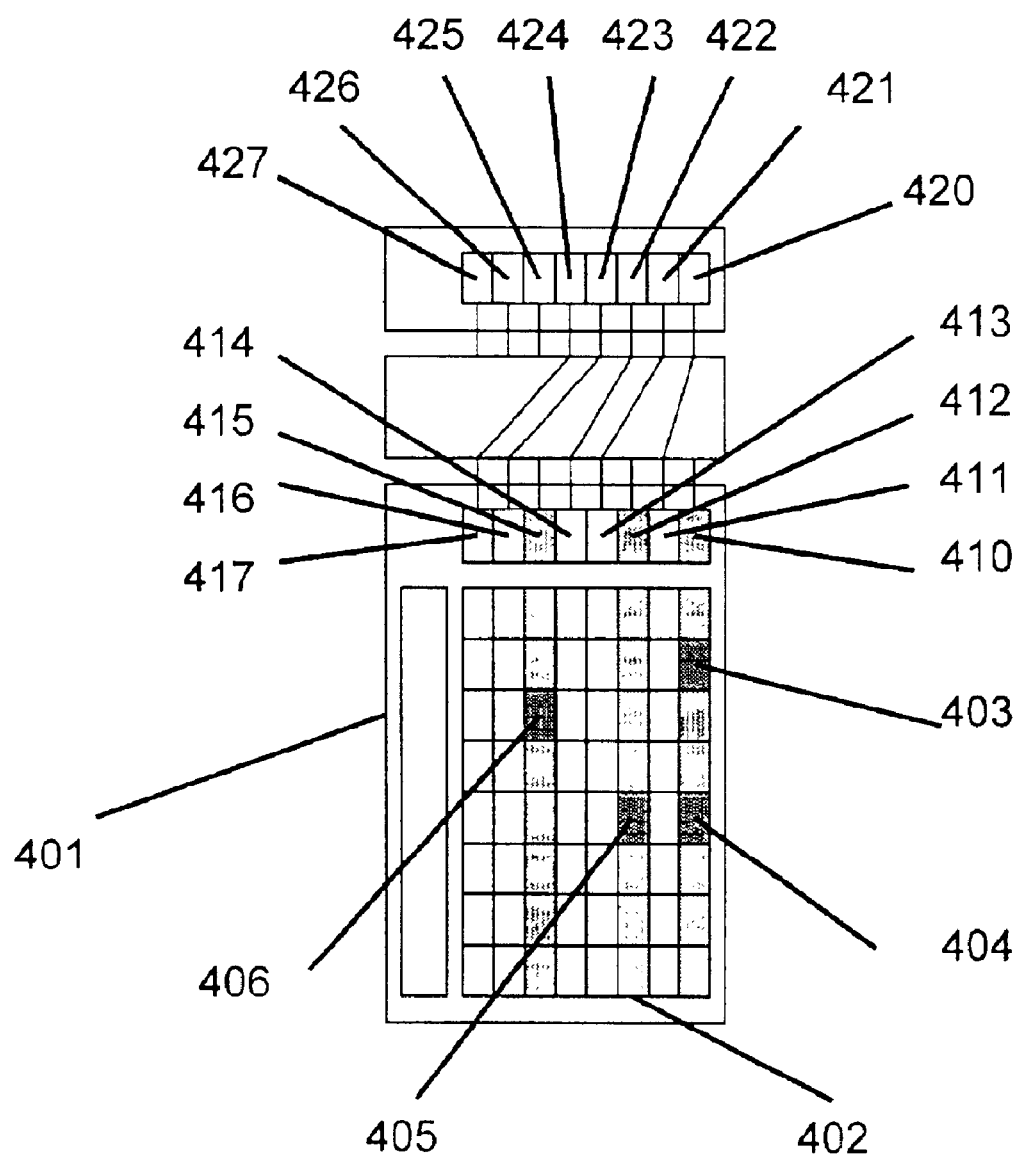
FIG. 4 shows another partially defective memory chip package.

FIG. 4 shows another partially defective memory chip package. In memory device 401, the memory cell array 402 contains defective memory cells within memory blocks 403, 404, 405, and 406.

The memory data bits corresponding to device data bit points 411, 413, 414, 416 and 417 are marked as functional because they do not contain any defective memory blocks. These data bit points are mapped onto chip data bit points 420, 421, 422, 423, and 424, each with a connecting mechanism. In this package, the connecting mechanisms are metal wires during a wire bonding process.

The memory data bits corresponding to device data bit points 410, 412, and 415 are marked as defective because they contain at least one defective memory blocks. These data bit points are mapped onto chip data bit points 425, 426, and 427, each with a disconnecting mechanism. In this package, the disconnecting mechanisms are open circuit conditions without any wire connections.

Figure 5:
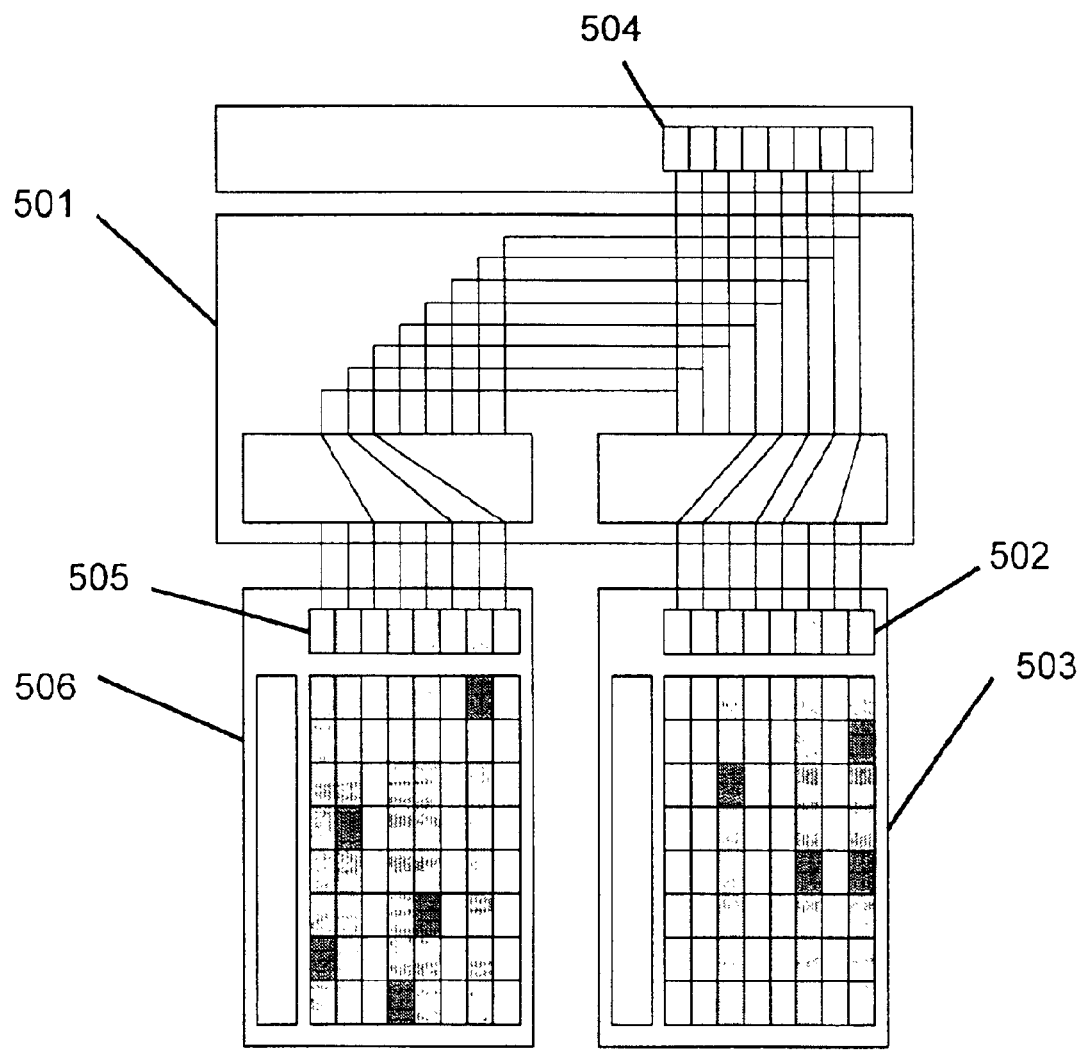
FIG. 5 shows another functional memory package constructed from two partially defective memory devices.

FIG. 5 shows another functional memory package constructed from two partially defective memory devices. The data bit mapping element 501 maps the device data bit points 502 of the memory device 503 to selected package data bit points 504 using a mapping structure similar to FIG. 4. It also maps the device data bit points 505 of the memory device 506 to remaining package data bit points using a similar mapping structure.

Figure 6:
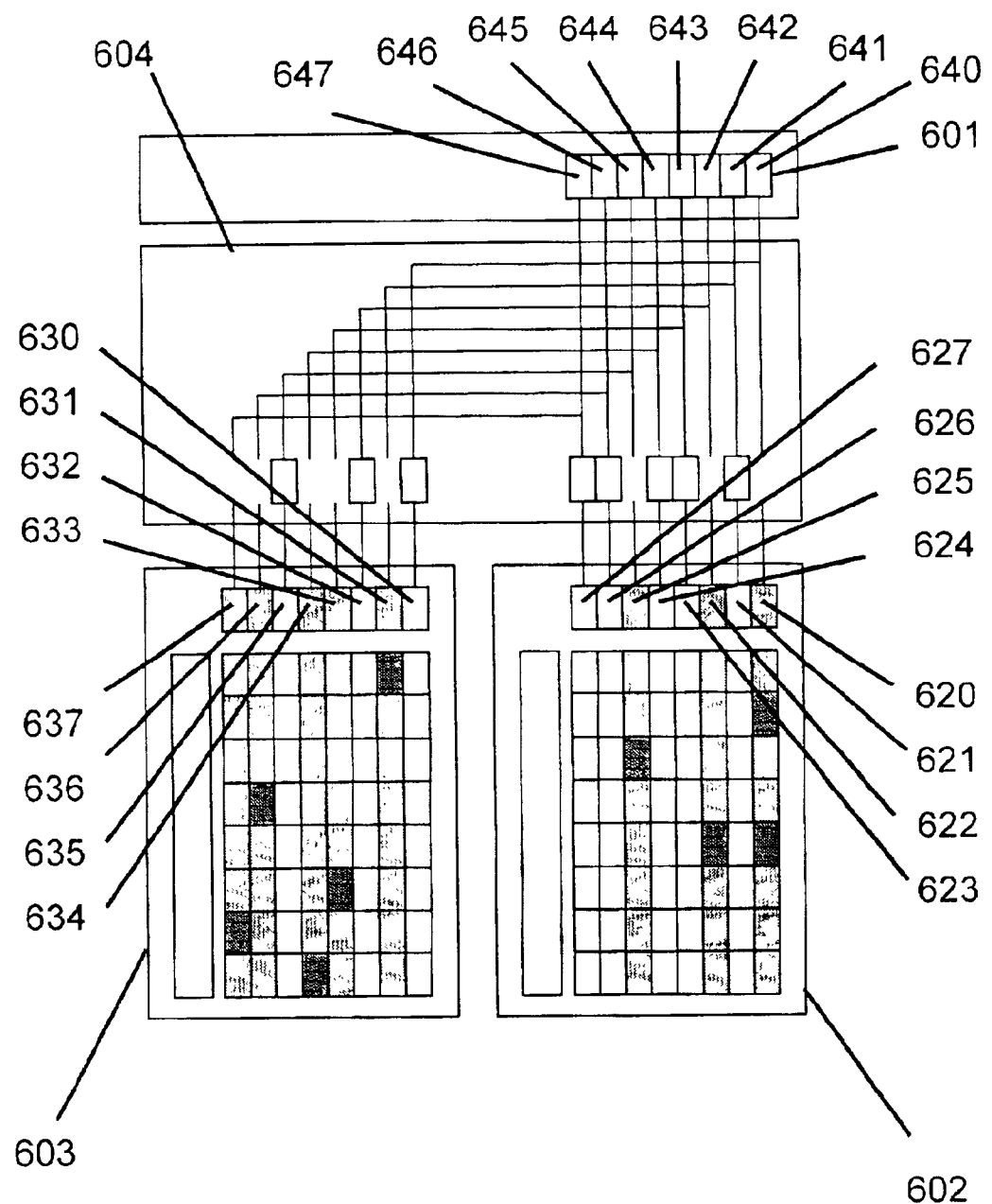
FIG. 6 shows a different configuration to construct a functional memory package from two partially defective memory devices.

FIG. 6 shows a different configuration to construct a functional memory package from two partially defective memory devices. The data bit mapping element 604 maps the device data bit points of the first memory device 602 and second memory device 603 to the memory package data bit points 601.

For the first memory device 602, the memory device data bit points 621, 623, 624, 626 and 627 are mapped onto package data bit points 641, 643, 644, 646 and 647, each with a connecting mechanism. In this package, the connecting mechanisms are low value resistors. The memory device data bit points 620, 622, and 625 are mapped onto package data bit points 640, 642, and 645, each with a disconnecting mechanism. In this preferred embodiment, the disconnecting mechanisms are open circuits without any connections.

For the second memory device 603, the memory device data bit points 630, 632, and 635 are mapped onto package data bit points 640, 642, and 645, each with a connecting mechanism. In this package, the connecting mechanisms are low value resistors. The memory device data bit points 631, 633, 634, 636 and 637 are mapped onto package data bit points 641, 643, 644, 646 and 647, each with a disconnecting mechanism. In this package, the disconnecting mechanisms are open circuits without any connections.

Figure 7:
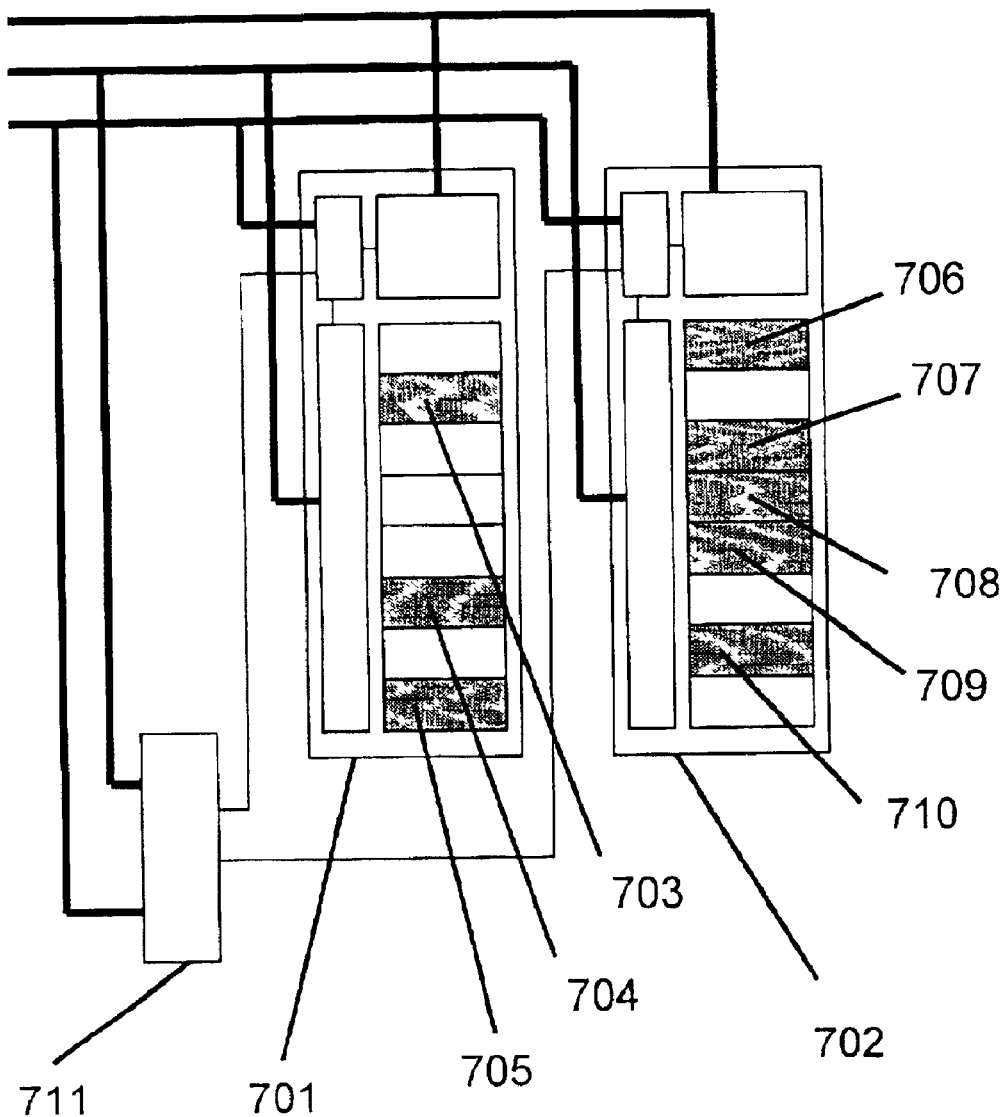
FIG. 7 shows another different configuration to construct a functional memory package from two partially defective memory devices.

FIG. 7 shows another different configuration to construct a functional memory package from two partially defective memory devices. In memory device 701, the memory cell array is divided into eight memory blocks. Memory device 701 contains defective memory cells within memory blocks 703, 704, and 705. Memory device 702 contains defective memory cells within memory blocks 706, 707, 708, 709, and 710, exactly the opposite of memory device 701. The memory access controller 711 controls the data input and output of the two memory units 701 and 702.

Figure 8:
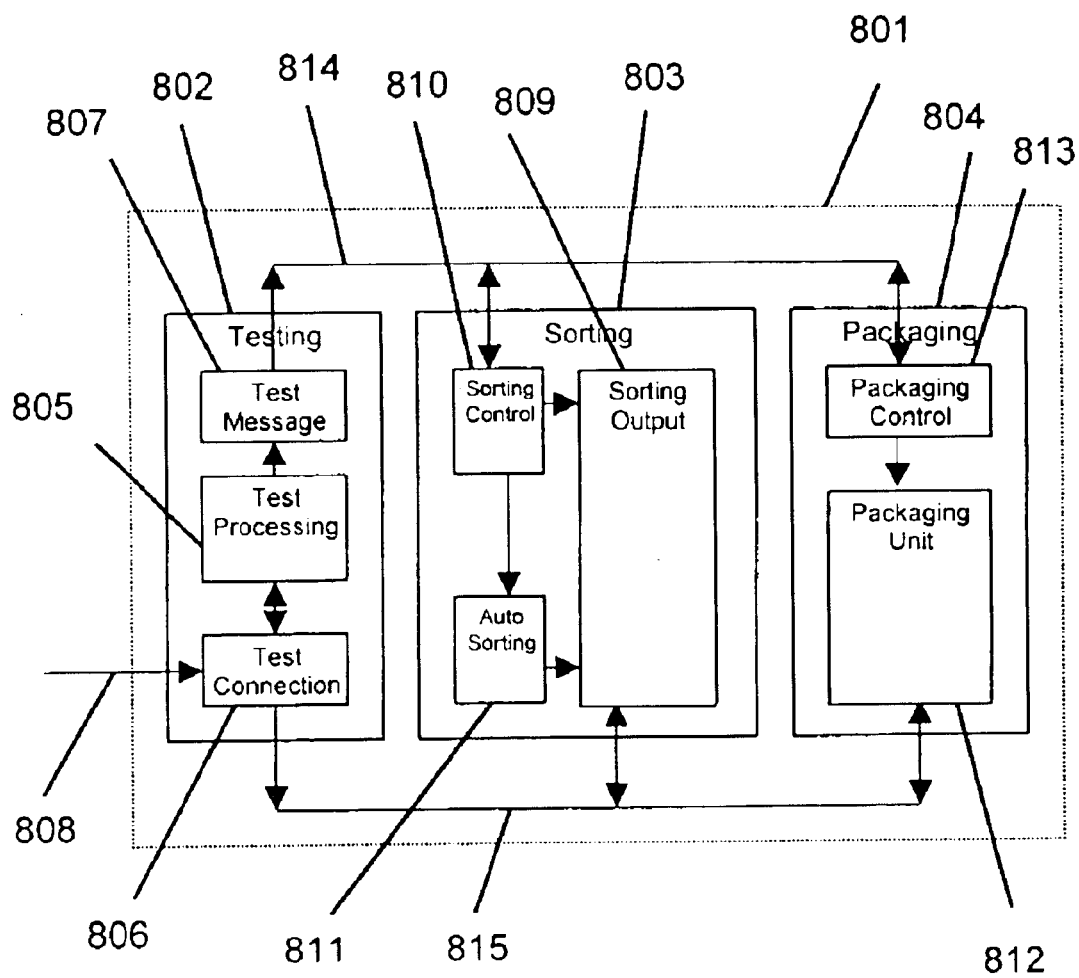
FIG. 8 is a preferred embodiment of the present invention for a testing, sorting, and packaging system.

FIG. 8 is a preferred embodiment of the present invention for a testing, sorting, and packaging system. The testing, sorting, and packaging system 801 consists of a testing subsystem 802, a sorting subsystem 803, and a packaging subsystem 804.

The testing subsystem 802 contains a test processing unit 805, a test connection unit 806, and a test message unit 807.

The device under test from the test input 808 is placed on the test connection unit 806, manually or automatically. For a semiconductor memory die, the test connection unit is typically a probing card or a loading board with a connector for test signal contacts. For semiconductor chip, the test connection is a typically a socket, a connector, an adaptor, or a printed circuit board.

The test processing unit 805 performs a set of tests on the device under test and generates memory device type and configuration information according to the test results. The device information is forwarded to the test message unit 807 in order to be further forwarded to other subsystems. The device information may be in the form of printed label, memory storage, or communication signals. It may also be displayed for local monitoring.

For device sorting, the test message unit 807 forwards the device information to the sorting subsystem 803 through the device information path 814. The device under test is transferred to the sorting subsystem 803 through the device transportation path 815.

The sorting subsystem 803 contains a sorting output unit 809 to accept the memory device from the device transportation path 815. The sorting output unit 809 contains a number of sorting output trays. Each sorting output tray consists of a number of sorting output entry cells.

The sorting unit 803 also contains a sorting control unit 810. The sorting control unit 810 receives device information from test massage unit 807 through the device information path 814.

The sorting control unit 810 transforms the device information into instruction to place the device into the selected sorting output tray or selected sorting output entry cell.

The device may also be placed in the selected tray or selected entry cell automatically by an automatic sorting mechanism 811.

Sorted memory devices may be transferred to the packaging subsystem 804 through the device transport path 815 for chip or module packaging. Additional device configuration information may be forwarded to the packaging subsystem 804 through the device information path 814.

The packaging subsystem contains a packaging unit 812 and a packaging control unit 813. For chip packaging, the packaging subsystem 804 is a wire bonding machine. For module packaging, the packaging subsystem 804 is a component placement or assembly machine.

The packaging control unit 813 controls the chip or module packaging according to the device information provided by the test subsystem 802 or the sorting subsystem 803.

Alternatively, after the test processing, memory devices may be transferred to the packaging subsystem first to perform device packaging according to the device types and configurations.

By doing so, the number of memory device configuration types may be reduced as illustrated in FIG. 4.

After packaging, the devices are then transferred to the sorting subsystem for sorting through the device transport path 815. Additional device type and configuration information is also forwarded from the packaging subsystem through the device information path 814.

Figure 9:
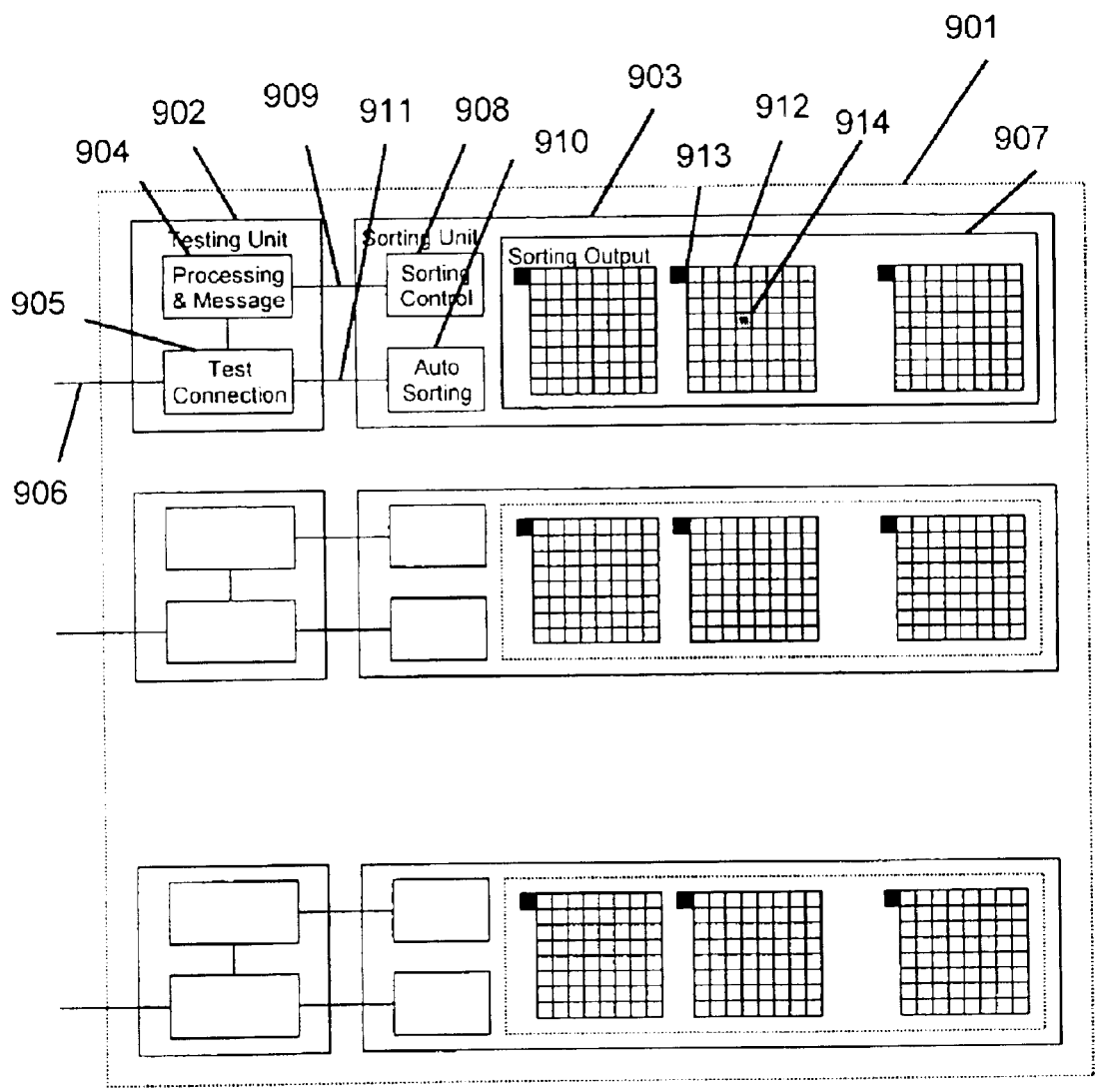
FIG. 9 shows a preferred embodiment of the present invention for a testing and sorting system.

FIG. 9 shows a preferred embodiment of the present invention for a testing and sorting system. The testing and sorting system 901 consists of a number of testing and sorting subsystems. Each subsystem consists of a testing unit 902 and a sorting unit 903.

A testing unit 902 contains a test processing and message unit 904 and a test connection unit 905. The device under test from the test input 906 is placed on the test connection unit 905.

The test processing and message unit 904 performs a set of tests on the device under test, through the test connection unit 905 and generates device type and configuration information according to the test results.

As an example, the testing unit 902 tests the memory devices first according to certain minimum characteristics requirements such as voltage and current levels. For devices that meet the minimum requirements, the testing unit 902 tests the logical functions and divides them into functional types, subtypes, and configurations.

After test processing, the device under test is transferred to the sorting unit 903 through the device transport path 911. The sorting unit 903 contains a sorting output unit 907. The sorting output unit 907 contains a number of sorting output trays 912. Each sorting output tray consists of a number of sorting output entry cells 914.

As a first example, the memory devices that meet the minimum requirements may be divided into 1 fully functional type, 1 fully defective type, and 255 partially defective types. With this partitioning method, the sorting output unit 907 contains at least 255 output trays for the partially defective devices. Each output tray in this example contains only one device type.

The fully functional devices, fully defective devices, and devices not meeting the minimum requirements may be placed in additional output trays, or handled separately from the sorting unit.

The sorting unit 903 also contains a sorting control unit 908. The sorting control unit 908 receives device information from test processing and massage unit 904 through the device information path 909.

The sorting control unit 908 transforms the device information into device placement instruction to place the device into the selected sorting output tray 912 or selected sorting output entry cell 914.

In this example, there is a tray selection indicator light 913 built in next to each sorting output tray 912.

Upon receiving the device information from the testing unit 902, the sorting control unit 908 turns on the tray selection indicator light 913 to identify the selected output tray 912.

The device may be manually placed into an output entry cell in the selected output tray. The device may also be placed in the selected tray or selected entry cell automatically by an automatic sorting mechanism 910.

As a second example, the partially defective memory devices may be divided into 7 major device types, according to the number of functional data bits. With this partitioning method, the sorting output unit 907 contains at least 7 output trays.

In this example, each output tray contains devices with the same number of functional data bits, but for each device the functional bit positions may be different.

To properly sort the devices, the sorting control unit 908 needs to assign additional device configuration information to each sorted device for further processing in other equipment such as a packaging machine.

In this example, there is an entry cell selection indicator light built in next to each sorting output entry cell 914.

Upon receiving the device information from the testing unit 902, the sorting control unit 908 turns on the entry cell selection indicator light to identify the selected output entry cell 914 to place the device, either manually or automatically.

The sorting control unit 908 assigns additional device configuration information to each sorted device by assigning the information to the corresponding sorting output entry cell 914 that carries the sorted device.

The assigned device information will be forwarded to other equipment, together with the device itself.

Figure 10:
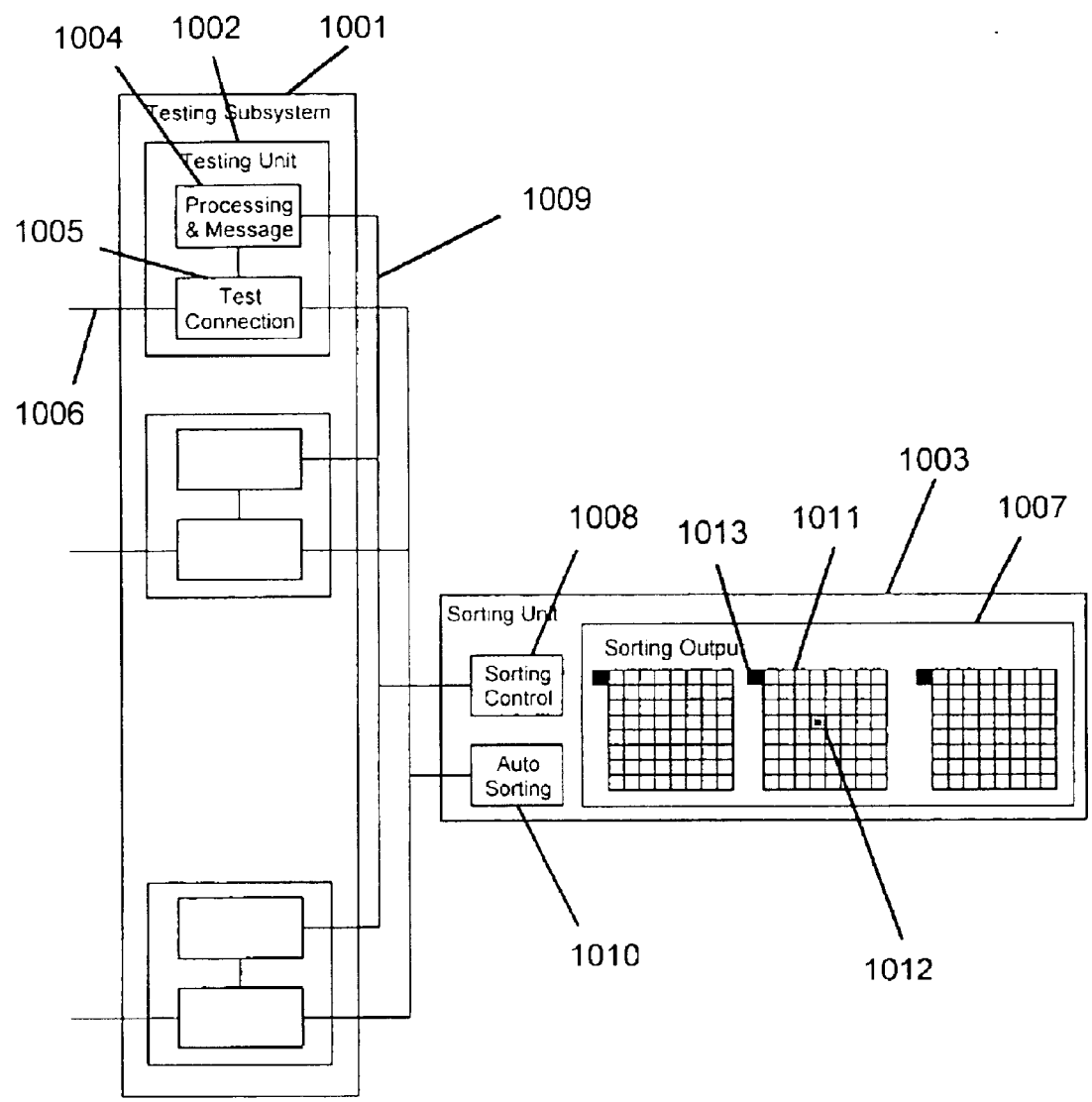
FIG. 10 is another preferred embodiment of the present invention for a testing and sorting system.

FIG. 10 is another preferred embodiment of the present invention for a testing and sorting system. In this preferred embodiment, a number of testing units share a common sorting unit. It is more cost-effective especially when the device testing time is much longer than the device sorting time.

In this preferred embodiment, the testing and sorting system consists of a testing subsystem 1001 and a sorting unit 1003. The test subsystem 1001 consists of a number of testing units 1002.

A testing unit 1002 contains a test processing and message unit 1004 and a test connection unit 1005. The device under test from the test input 1006 is placed on the test connection unit 1005.

After test processing, the device under test is transferred to the sorting unit 1003. The sorting unit 1003 contains a sorting output unit 1007. The sorting output unit 1007 contains a number of sorting output trays 1011. Each sorting output tray consists of a number of sorting output entry cells 1012.

The sorting unit 1003 also contains a sorting control unit 1008. The sorting control unit 1008 receives device information 1009 from a number of test processing and message units in the form of printed label, memory storage, or communication signals.

The sorting control unit 1008 transforms the device information into device placement instruction to place the device into the selected sorting output tray 1011 or selected sorting output entry cell 1012.

The sorting control unit 1008 uses tray selection indicator lights 1013 or entry cell selection indicator lights as instructions for manual placement of devices. The device may also be placed in the selected tray or selected entry cell automatically by an automatic sorting mechanism 1010.

An output tray may also contain a position sensor at each output entry cell. The sorting control unit monitors the status of the output entry cell position sensors to determine whether the device has been properly placed in the selected cell.

Figure 11:
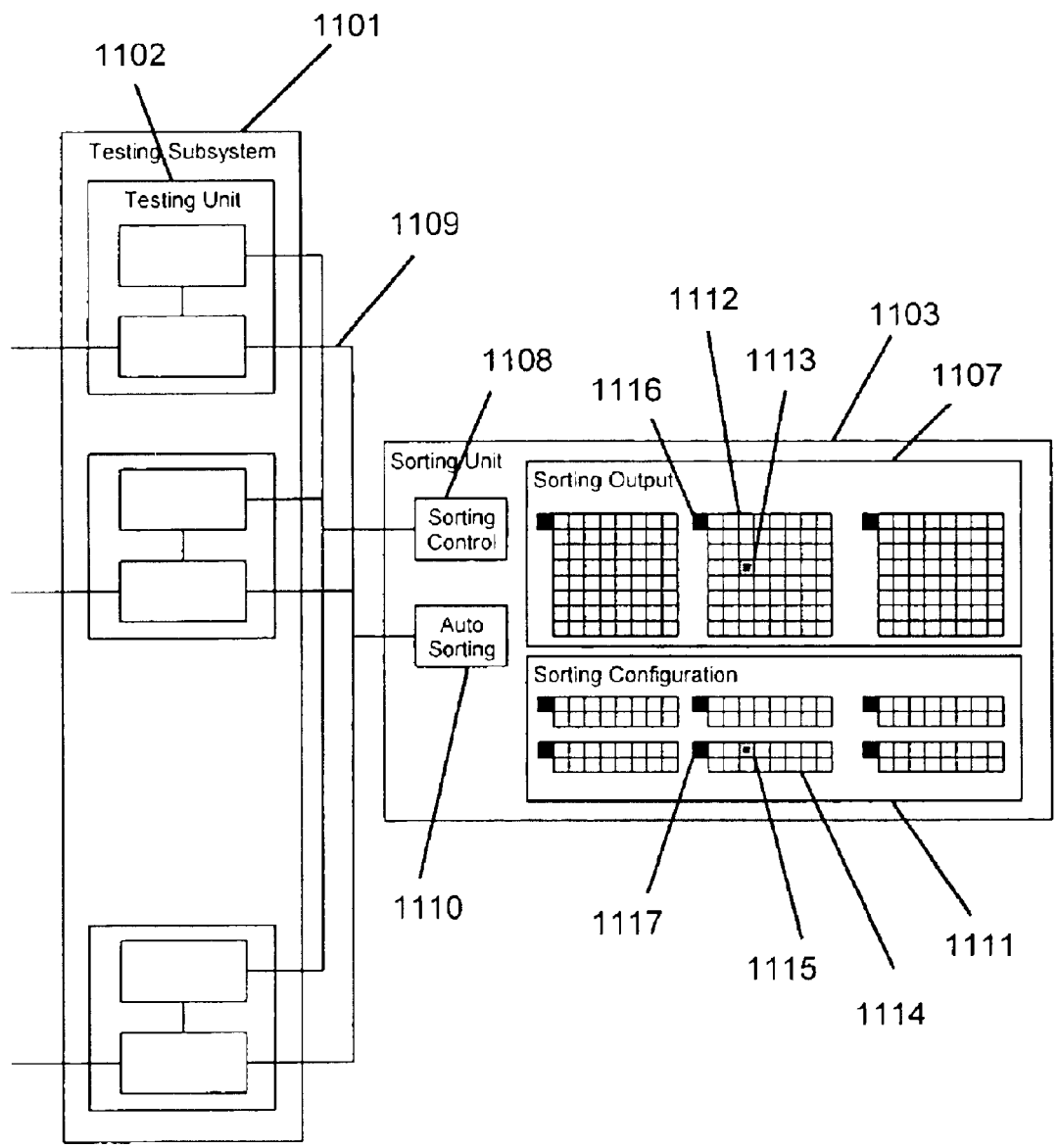
FIG. 11 is another preferred embodiment of the present invention for a testing and sorting system.

FIG. 11 is another preferred embodiment of the present invention for a testing and sorting system. In this preferred embodiment, the sorting unit contains more types of device trays. In addition to sorting the devices by the device types, this preferred embodiment also organizes the devices according to certain predefined configurations.

The testing and sorting system consists of a testing subsystem 1101 and a sorting unit 1103. The test subsystem 1101 consists of a number of testing units 1102.

After test processing, the device under test is transferred to the sorting unit 1103. The sorting unit 1103 contains a sorting output unit 1107 and a sorted configuration unit 1111.

The sorting output unit 1107 contains a number of sorting output trays 1112. Each sorting output tray consists of a number of sorting output entry cells 1113. The sorting output unit 1107 partitions the devices according to the major device types.

The sorted configuration unit 1111 contains a number of sorted configuration trays 1114. Each sorting output tray consists of a number of sorted configuration entry cells 1115. The sorted configuration unit 1111 partitions the devices according to the target configurations.

The sorting unit 1103 contains a sorting control unit 1108. The sorting control unit 1108 receives device information 1109 from a number of test processing and message units in the form of printed label, memory storage, or communication signals.

The sorting control unit 1108 transforms the device information into device placement instruction. According to the placement instruction, a device may be placed into the selected sorting output tray 1112 or selected sorting output entry cell 1113 in the sorting output unit 1107. The device may also be placed into the selected sorted configuration tray 1114 or selected sorted configuration entry cell 1115 in the sorted configuration unit 1111.

In addition, the sorting control unit 1108 may generate a device reorganization instruction to move a selected device currently in the sorting output unit 1107 to a selected location in the sorted configuration unit 1111. The objective of the device reorganization is to sort the devices to form a set of predefined target configurations for a chip or module package.

The sorting control unit 1108 uses output tray selection indicator lights 1116 or output entry cell selection indicator lights to identify a location in the sorting output unit 1107. The sorting control unit 1108 also uses configuration tray selection indicator lights 1117 or configuration entry cell selection indicator lights to identify a location in the sorted configuration unit 1111.

The indicator lights are used as instructions for manual placement of devices. The device may also be placed in the selected output tray, output entry cell, configuration tray, or configuration entry cell by an automatic sorting mechanism 1110.

An output tray may also contain a position sensor at each output entry cell or configuration entry cell. The sorting control unit monitors the status of the entry cell position sensors to determine whether the device has been properly placed in the selected entry cell.

As an example, the sorting output unit 1107 contains 7 output trays, indexed from 1 to 7, according to the number of functional bits. The sorting unit 1103 first receives a device with 5 functional bits as shown in FIG. 2. This device will be placed in output tray 5. The device configuration is assigned to the selected output entry cell.

The sorting unit 1103 then receives a device with 3 functional bits, which is the counterpart of the first device as shown in FIG. 3. The sorting control unit 1108 may use at least two sorting strategies to sort the devices.

With a first sorting strategy, the sorting control unit 1108 may instruct the second device to be placed in output tray 3 at this time. It may control the reorganization of the devices at a later time to move both the first device and the second device from the output trays in the sorting output unit 1107 to the target configuration tray in the sorted configuration unit 1111.

With a second sorting strategy, the sorting control unit 1108 may instruct the second device to be placed in the target configuration tray directly. It will also control the device reorganization to move first device from the output trays in the sorting output unit 1107 to the target configuration tray in the sorted configuration unit 1111.

The device reorganization may be performed either manually or by an automatic routing mechanism.

The sorted configuration trays in the sorted configuration unit may be detachable in order to be transported to a packaging machine. The output trays in the sorting output unit may also be detachable to be transported to a packaging machine.

To make the device transport path and device information path may flexible, a detachable device carrier may be used as a temporary holding mechanism for the devices.

Figure 12:
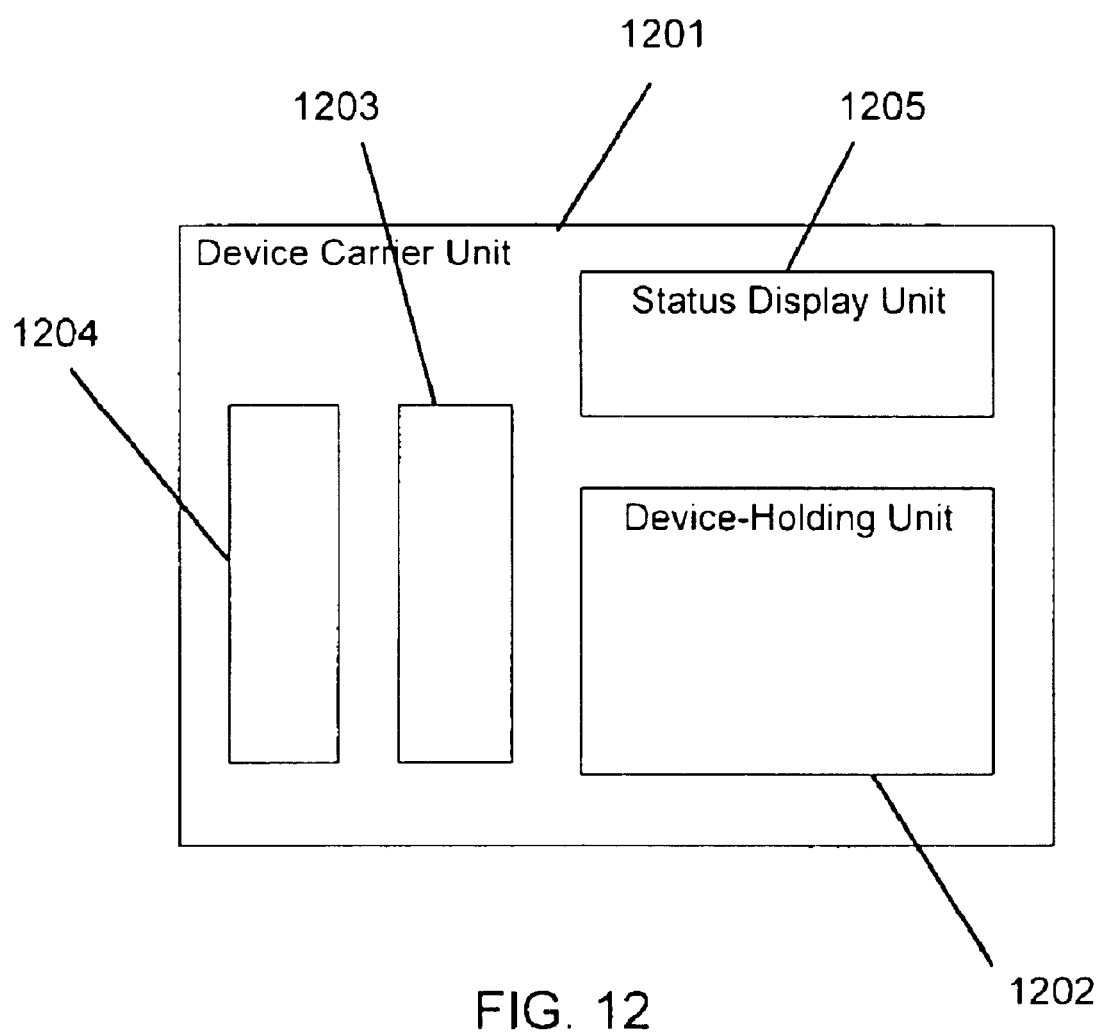
FIG. 12 is a preferred embodiment of the present invention for a detachable device carrier.

FIG. 12 shows a preferred embodiment of the present invention for a detachable device carrier. In this preferred embodiment, the device carrier unit 1201 contains a device-holding unit 1202, a device information storage unit 1203, and an interface unit 1204. The device carrier unit may also includes a status display unit 1205.

The device carrier unit 1201 may be attached to a testing unit to send or receive device information through the interface unit 1204. The device information is stored in device information storage unit 1203. At the same time, the device is placed in the device-holding unit 1202.

The device carrier unit 1201 may then be removed from the testing unit. When the device carrier unit is attached to the sorting unit, the corresponding device information is transferred to the sorting control unit through interface unit 1204. The sorting control unit uses the device information to control the sorting and placement of the subject device.

The device-holding unit 1202 may contain more than one device. In that case, the device information for each individual device is maintained in device information storage unit 1203 according to the position of the device.

The device carrier unit 1201 may also be attached to a packaging machine to send or receive device information and to control the handling of the device.

I claim:

1. A memory device die or chip testing, sorting, and packaging system comprising:

(a) a plurality of test processing units;

(b) a plurality of test connection units;

(c) a plurality of test messaging units;

(d) a plurality of sorting control units;

(e) a plurality of sorting output units;

(f) a plurality of packaging units;

(g) a plurality of packaging control units, wherein said test processing units perform tests on a plurality of memory devices placed on said test connection units and generate a plurality of memory device type or configuration identifiers, one for each of the memory devices according to test results;

wherein said memory device type or configuration identifiers are forwarded directly or indirectly from said processing units to said test messaging units, said sorting control units, or said packaging control units;

wherein said memory devices are transferred from said test processing units to said sorting output units according to instructions from said sorting control units based on memory device type or configuration identifiers directly or indirectly from said test messaging units;

wherein said memory devices are packaged into memory chips or memory modules in said packaging units according to instructions from said packaging control units based on memory device type or configuration identifiers directly or indirectly from said test messaging units or said sorting control units.

2. The memory device or chip testing, sorting, and packaging system of claim 1, wherein said test processing units are in-circuit memory test systems, special memory testers, or automatic test equipments.

3. The memory device or chip testing, sorting, and packaging system of claim 1, wherein said test connection units are die probing cards, chip sockets, connectors, adaptors, or printed circuit boards with passive, active, or logic components.

4. The memory device or chip testing, sorting, and packaging system of claim 1, wherein said test messaging units are printing devices, memory devices, storage devices, or electrical, optical, or wireless communication links.

5. The memory device or chip testing, sorting, and packaging system of claim 1, wherein said sorting output units contain a plurality of output trays, each having a plurality of output entry cells.

6. The memory device or chip testing, sorting, and packaging system of claim 1, wherein said sorting output units contain a plurality of output ways, each having a plurality of output entry cells;

wherein said sorting output units contain a plurality of position selection indicators, each located next to one of the output trays or one of the output entry cells;

wherein said sorting control units accept memory device type or configuration identifiers and light up position selection indicators to identify selected output trays or selected output entry cells to place memory devices.

7. The memory device or chip testing, sorting, and packaging system of claim 1,
wherein said sorting output units contain a plurality of output trays, each having a plurality of output entry cells;
wherein said sorting control units accept memory device type or configuration identifiers and control a plurality of automatic routing units to transfer memory devices to selected output trays or output entry cells.

8. The memory device or chip testing, sorting, and packaging system of claim 1,
wherein said sorting output units contain a plurality of output trays, each having a plurality of output entry cells;
wherein said sorting output units contain a plurality of position sensors, each located next to one of the output trays or one of the output entry cells;
wherein said sorting control units monitor the status of position sensors to determine whether memory devices are properly placed in selected output trays or output entry cells.

9. The memory device or chip testing, sorting, and packaging system of claim 1,
wherein said sorting output units contain a plurality of sorted configuration output trays, each having a plurality of output entry cells;
wherein said sorting control units maintain a plurality of memory device configuration mapping tables and determine whether some matching groups of memory devices are to be placed in selected sorted configuration output trays or output entry cells.

10. The memory device or chip testing, sorting, and packaging system of claim 1, wherein said packaging units are wire bonding machines, multiple-chip module assembly machines, or printed circuit board assembly machines.

11. The memory device or chip testing, sorting, and packaging system of claim 1, wherein said packaging control units accept memory device type or configuration identifiers and control said packaging units to perform wire bonding, component placement, or circuit assembly.

12. The memory device or chip testing, sorting, and packaging system of claim 1, further comprises a plurality of detachable memory device carrier units to transport memory devices between test connection units, sorting output units, or packaging units, said device carrier units contain a plurality of device carrier entry cells, a plurality of device descriptions in the form of printed labels or memory storages, and a plurality of interface units to send or receive device descriptions to or from test messaging units, sorting control units, or packaging control units.

13. The memory device or chip testing, sorting, and packaging system of claim 1,
wherein said sorting output units contain a plurality of output trays, each having a plurality of output entry cells;
wherein said output trays are detachable from the sorting output units.

14. The memory device or chip testing, sorting, and packaging system of claim 1,
wherein said sorting output units contain a plurality of output trays, each having a plurality of output entry cells;
wherein said output trays contain a plurality of device entry cells, a plurality of device descriptions in the form of printed labels or memory storages, and a plurality of interface units to send or receive device descriptions.

15. The memory device or chip testing, sorting, and packaging system of claim 1, wherein said memory devices are first being sorted and then being packaged.

16. The memory device or chip testing, sorting, and packaging system of claim 1, wherein said memory devices are first being packaged and then being sorted.

17. A memory device die or chip testing and sorting system comprising:
(a) a plurality of test processing units;
(b) a plurality of test connection units;
(c) a plurality of test messaging units;
(d) a plurality of sorting control units;
(e) a plurality of sorting output units;
wherein said test processing units perform tests on a plurality of memory devices placed on said test connection units and generate a plurality of memory device type or configuration identifiers, one for each of said memory devices according to test results;
wherein said memory device type or configuration identifiers are forwarded directly or indirectly from said processing units to said test messaging units, or said sorting control units;
wherein said memory devices are transferred from said test processing units to said sorting output units according to instructions from said sorting control units based on memory device type or configuration identifiers directly or indirectly from said test messaging units.

18. The memory device or chip testing and sorting system of claim 17, wherein said test processing units are in-circuit memory test systems, special memory testers or automatic test equipments.

19. The memory device or chip testing and sorting system of claim 17, wherein said test connection units are die probing cards, chip sockets, connectors, adaptors, or printed circuit boards with passive, active, or logic components.

20. The memory device or chip testing and sorting system of claim 17, wherein said test messaging units are printing devices, memory devices, storage devices, or electrical, optical, or wireless communication links.

21. The memory device or chip testing and sorting system of claim 17, wherein said sorting output units contain a plurality of output trays, each having a plurality of output entry cells.

22. The memory device or chip testing and sorting system of claim 17,
wherein said sorting output units contain a plurality of output trays, each having a plurality of output entry cells;
wherein said sorting output units contain a plurality of position selection indicators, each located next to one of the output trays or one of the output entry cells;
wherein said sorting control units accept memory device type or configuration identifiers and light up position selection indicators to identify selected output trays or selected output entry cells to place memory devices.

23. The memory device or chip testing and sorting system of claim 17,
wherein said sorting output units contain a plurality of output trays, each having a plurality of output entry cells;
wherein said sorting control units accept memory device type or configuration identifiers and control a plurality of automatic routing units to transfer memory devices to selected output trays or output entry cells.

24. The memory device or chip testing and sorting system of claim 17,
wherein said sorting output units contain a plurality of output trays, each having a plurality of output entry cells;

wherein said sorting output units contain a plurality of position sensors, each located next to one of the output trays or one of the output entry cells;

wherein said sorting control units monitor the status of position sensors to determine whether memory devices are properly placed in selected output trays or output entry cells.

25. The memory device or chip testing and sorting system of claim 17, wherein said sorting output units contain a plurality of sorted configuration output trays, each having a plurality of output entry cells;

wherein said sorting control units maintain a plurality of memory device configuration mapping tables and determine whether some matching groups of memory devices are to be placed in selected sorted configuration output trays or output entry cells.

26. The memory device or chip testing and sorting system of claim 17, further comprises a plurality of detachable memory device carrier units to transport memory devices between test connection units and sorting output units, said device carrier units contain a plurality of device carrier entry cells, a plurality of device descriptions in the form of printed labels or memory storages, and a plurality of interface units to send or receive device descriptions to or from test messaging units or sorting control units.

27. The memory device or chip testing and sorting system of claim 17, wherein said sorting output units contain a plurality of output trays, each having a plurality of output entry cells;

wherein said output trays are detachable from the sorting output units.

28. The memory device or chip testing and sorting system of claim 17, wherein said sorting output units contain a plurality of output trays, each having a plurality of output entry cells;

wherein said output trays contain a plurality of device entry cells, a plurality of device descriptions in the form of printed labels or memory storages, and a plurality of interface units to send or receive device descriptions.

29. A memory device die or chip sorting system comprising:

(a) a plurality of sorting output units;

(b) a plurality of sorting control units;

(c) a plurality of input interface units;

wherein said sorting output units contain a plurality of output trays, each contains a plurality of output entry cells;

wherein said sorting control units accept memory device type or configuration identifiers through said input interface units;

wherein a plurality of memory devices are transferred to said sorting output units according to instructions from said sorting control units based on the memory device type or configuration identifiers.

30. The memory device or chip sorting system of claim 29, wherein said memory device type or configuration identifiers are in the form of printed labels, memory storages, or electrical, optical, or wireless communication signals.

31. The memory device or chip sorting system of claim 29, wherein said sorting output units contain a plurality of output trays, each having a plurality of output entry cells;

wherein said sorting output units contain a plurality of position selection indicators, each located next to one of the output trays or one of the output entry cells;

wherein said sorting control units accept memory device type or configuration identifiers and light up position selection indicators to identify selected output trays or selected output entry cells to place memory devices.

32. The memory device or chip sorting system of claim 29, wherein said sorting output units contain a plurality of output trays, each having a plurality of output entry cells;

wherein said sorting control units accept memory device type or configuration identifiers and control a plurality of automatic routing units to transfer memory devices to selected output trays or output entry cells.

33. The memory device or chip sorting system of claim 29, wherein said sorting output units contain a plurality of output trays, each having a plurality of output entry cells;

wherein said sorting output units contain a plurality of position sensors, each located next to one of the output trays or one of the output entry cells;

wherein said sorting control units monitor the status of position sensors to determine whether memory devices are properly placed in selected output trays or output entry cells.

34. The memory device or chip sorting system of claim 29, wherein said sorting output units contain a plurality of sorted configuration output trays, each having a plurality of output entry cells;

wherein said sorting control units maintain a plurality of memory device configuration mapping tables and determine whether some matching groups of memory devices are to be placed in selected sorted configuration output trays or output entry cells.

35. The memory device or chip sorting system of claim 29, further comprises a plurality of detachable memory device carrier units to transport memory devices to said sorting output unit, said device carrier units contain a plurality of device carrier entry cells, a plurality of device descriptions in the form of printed labels or memory storages, and a plurality of interface units to send or receive device descriptions.

36. The memory device or chip sorting system of claim 29, wherein said sorting output units contain a plurality of output frays, each having a plurality of output entry cells;

wherein said output trays are detachable from the sorting output units.

37. The memory device or chip sorting system of claim 29, wherein said sorting output units contain a plurality of output trays, each having a plurality of output entry cells;

wherein said output trays contain a plurality of device entry cells, a plurality of device descriptions in the form of printed labels or memory storages, and a plurality of interface units to send or receive device descriptions.

* * * * *